United States Patent

Sarjeant

[11] 4,051,432
[45] Sept. 27, 1977

[54] ATTENUATOR FOR MEASURING HIGH VOLTAGE FAST RISE TIME PULSES

[75] Inventor: Walter J. Sarjeant, Ottawa, Canada
[73] Assignee: Canadian Patents & Development Limited, Ottawa, Canada
[21] Appl. No.: 710,786
[22] Filed: Aug. 2, 1976
[51] Int. Cl.$^2$ .................... G01R 31/02; H01P 1/22
[52] U.S. Cl. ..................... 324/72.5; 333/32; 333/81 A
[58] Field of Search .......... 324/72.5; 333/32, 33, 333/81 A, 24.1, 97 R

[56] References Cited

U.S. PATENT DOCUMENTS

| 2,973,492 | 2/1961 | Mack | 333/97 |
|---|---|---|---|
| 3,025,480 | 3/1962 | Guanella | 333/33 |
| 3,370,257 | 2/1968 | Spierling | 333/33 |
| 3,412,327 | 11/1968 | Murray | 324/72.5 |
| 3,532,982 | 10/1970 | Ziedlhack et al. | 324/72.5 X |
| 3,634,789 | 1/1972 | Stuckert | 333/81 A |

Primary Examiner—Rudolph V. Rolinec
Assistant Examiner—Vincent J. Sunderdick
Attorney, Agent, or Firm—Edward Rymek

[57] ABSTRACT

A probe type high voltage attenuator for a pulse measuring system to provide an overall rise time of less than 50 picoseconds with a peak voltage capability of 20 kV. Attenuator perturbations at the 50 ohm impedance level are minimized by providing a high resistance in series with a lossy distributed transmission line. The reflection waves from the attenuator are absorbed by this lossy distributed transmission line minimizing perturbation of the source being measured. The attenuator is of a shielded type to minimize interference from extraneous fields.

7 Claims, 6 Drawing Figures

ATTENUATOR FOR MEASURING HIGH VOLTAGE FAST RISE TIME PULSES

This invention is directed to an attenuator for use in the measurement of point voltage sources in electric circuits and in particular to an attenuator which produces minimum loading on high voltage sources in the measurement of fast rise time pulses.

Numerous applications of subnanosecond high voltage generators, such as drivers for electro-optical streak camera and Pockels' Cell optical modulators require a reliable, polarity independent voltage measurement system. Subnanosecond high voltage attenuators which are used in conjunction with oscilloscopes have been developed and are suitable for measuring pulse amplitudes up to 5 kV. However, these attenuators are not suitable for fast laser light modulators and switching systems operating at voltages of the order of 15 kV, since they load the circuits if used in a measuring system for developmental diagnostics, or for the monitoring of the shape of ultrafast voltage pulses having subnanosecond rise and fall times. In addition, these attenuators or probes, if they are of the shield type, can cause circuit perturbation for point source voltage probing in 50 ohm systems.

It is therefore an object of this invention to provide an attenuator for the measurement of high voltages at point sources.

It is a further object of this invention to provide an attenuator for the measurement of high voltage pulses having fast rise and fall times.

It is another object of this invention to provide an effective attenuator in the form of a probe.

There and other objects are achieved in an attenuator which includes a resistor connected in series with a frequency dependent distributed resistance. The resistor is located within a coaxial connector used to connect the output of the attenuator to a coaxial line. The distributed resistance is mounted on a center wire which connects the afore mentioned resistor to the input terminal of the attenuator to maintain frequency independent attenuation and to absorb reflected energy from the attenuator thus preventing perturbation in the measured circuit.

Figure 3:
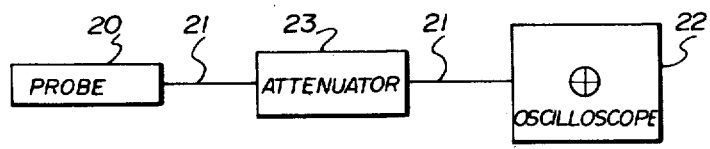
Figure 4A:
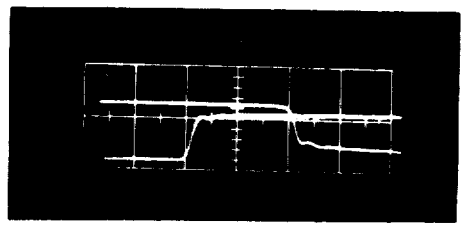
Figure 4B:
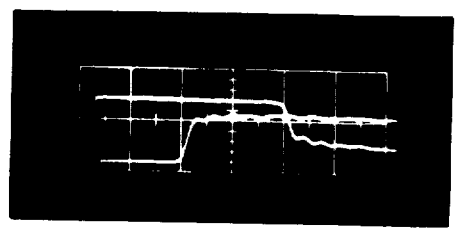
Figure 5:
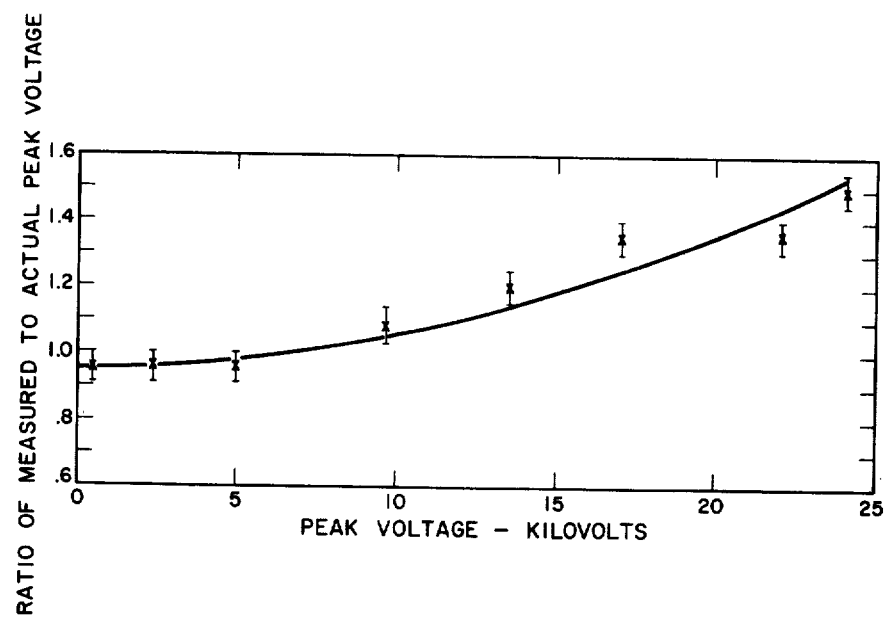

FIG. 3 schematically illustrates the measuring system;

FIGS. 4a and 4b each show the leading and falling edges of the probe input and output voltage respectively, and FIG. 5 shows the ratio of the probe output voltage as a function of applied peak voltage.

Figure 1:
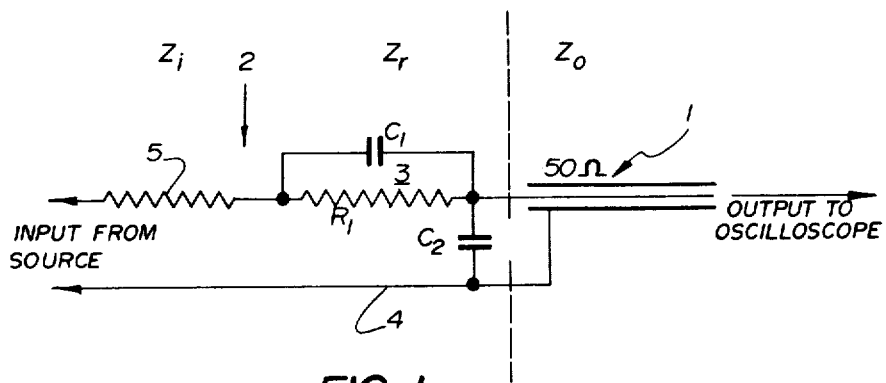
FIG. 1 illustrates the equivalent circuit of the attenuator in accordance with the present invention.

The principles of the invention will be described with respect to the simplified equivalent circuit shown in FIG. 1. The measurement of point voltage sources is achieved through the use of a conventional oscilloscope connected to the source by an appropriately terminated 50Ω coaxial cable in series with one or more attenuators or voltage dividers. In FIG. 1, the coxaial cable 1 having an impendance $Z_o$, usually 50Ω is shown. The attenuators 2 in accordance with the present invention includes a resistor 3 which has a high resistance imput impedance $R_1$ at low frequencies, i.e. below 50 MHz, with a predetermined reactive impedance represented by $C_1$, across the resistor 3 and by $C_2$ between the resistor 3 and the outer ground conductor 4.

At high frequencies, the equivalent line impedance for $A_p$, if $R_1$ was zero ohms, would be below $Z_o$ indicating that there would be a substantial reflection back towards the source. In order to reduce these reflections and their subsequent perturbation on the circuit being measured, a distributed, resistively loaded transmission line 5 having an impedance $Z_i$ is connected between the source and resister 3. This transmission line 5 is designed such that for low frequencies, i.e. below 100 MHz, the resistive impedance of the attenuator 2 is essentially the resistive impedance $R_1$ of resistor 3. For fast pulse rise time, this reduces to the surge impedance of the distributed resistive loaded transmission line. Reflections on this line, whose surge impedance is greater than $Z_o$, are absorbed by the resistive component of impedance 5, resulting in only small perturbations of the test point voltage.

Figure 2:
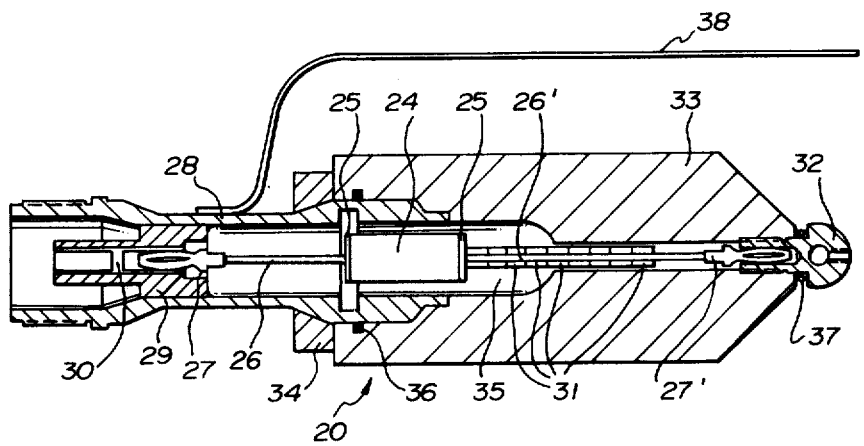
FIG. 2 illustrates a cross-section of the attenuator.

One embodiment of an attenuator in accordance with the present invention is shown in FIG. 2. This attenuator is given the form of a probe 20 which may be used in a measurement system by connecting it to a conventional oscilloscope 22 by a coaxial cable 21 with or without a further attenuator 23 as shown in FIG. 3. The voltage attenuator probe 20 illustrated in FIG. 2 is constructed using a carbon composition resistor 24 such as Allen Bradley type HB or its equivalent having a resistance of approximately 3,000Ω. The resistor 24 has internal end electrodes 25 which are connected to center wires 26 and 26'. At the end of each of the wires 26 and 26' a banana type plug 27, 27' is soldered. The resistor 24, wire 26 and plug 27 form the center conductor of a short coaxial line having an outer conductor 28. This outer conductor 28 may be of the shape of a UG-60A/U type connector which includes a plastic insulator 29 in which is sealed a double female plug 30 for connection to a fifty ohm transmission line. The banana plug 27 is inserted into one end of plug 30 and may be soldered in place. However, it is preferred that plug 27 not be soldered so as to allow resistor 24 to be adjusted along the length of the probe within outer conductor 28, thus permitting fine adjustment of the two time constants $R_1C_1$ and $Z_oC_2$ to minimize the variation of attenuation factor with frequency.

The distributed frequency dependent resistance (5 in FIG. 1) consists of a number of ferrite beads 31 inserted onto the center wire 26'. The beads 31 which may be of 4B type ferrite material made by Philips, are substantially resistive from 10 MHz to at least 0.5 GHz, and in FIG. 2 had a resistive component in excess of 250 ohms for frequencies above 100 MHz. For frequencies below 100 MHz, the ferrite remains substantially resistive, decreasing rapidly from approximately 2500 Ω/m at 100 MHz to approximately 300 Ω/m at 10 MHz. Thus at these lower frequencies, the resistive component of beads 31 becomes much less than resistor 24.

The wire 26' is held in place by the plug 27' which is inserted into a conducting input terminal 32 that may be made of brass. The terminal 32 is threaded into a probe nose piece 33 which is made of insulating material such as lucite or rexolite. The nose piece 33 is firmly fixed to the outer conducter 28 by an epoxy ring 34. The space 35 through the center of the nose piece 33 as well as inside the outer conductor 28 is filled with a dielectric fluid such as the Dow Corning type 200 dielectric fluid to further provide an insulating medium. To prevent leakage of the dielectric fluid, an O-ring seal 36 may be provided between outer conductor 28 and nose piece 33 and a further O-ring seal 37 may be provided between nose piece 33 and the threaded terminal 32.

Finally, the ground connection for the probe 20 may consist of a short 2 cm wide ground braid 38 soldered to outer conducter 28 or a rigid case encircling the probe front section.

The above probe has a 20 kV capability with a low-level rise time of less than 50 ps. As shown in FIG. 5, linearity for 100 ns (FWHM) pulse width is within 10% for peak voltages up to 10 kV, increasing to 20% at 15 kV, and system resistance stability per 1,000 pulses, up to 20 kV peak amplitude, is better than 0.5% for the above pulse width. Overshoot and ringing are less than 10% for the first 500 ps, decreasing to 6%, peak-to-peak, for pulse lengths up to 10 ms. In addition, as can be seen in FIG. 4a which is a recording of the rising and falling edges of a 400V pulse from a reed pulser and FIG. 4b in which is the corresponding probe output voltage on a time scale of 2ns per division, truncated pulses can be recorded with a resolution of ~ 100 ps.

When used in conjunction with oscilloscope this voltage probe system provides a reliable scope-limited measuring system for multi-kilovolt pulses at point sources in 50 ohm circuitry.

I claim:

1. An attenuator for measuring high voltage pulses from point voltage sources comprising:

coaxial connector means having a first central conductor, for connecting the attenuator to a coaxial line;

resistance means having one end connected to the central conductor, said resistance means being enclosed within a conducting shield to form a transmission line section;

terminal means for connecting the attenuator to the point voltage source to be measured, said terminal means being connected to the resistance means by a second central conductor;

frequency dependent distributed resistance means mounted on the second central conductor, said frequency independant resistance being substantially resistive at frequencies greater than 10 MHz, to maintain frequency independent attenuation of the attenuator and to absorb reflected energy from the attenuator; and ground conductor means fixed to the conducting shield for connecting the shield to the point voltage source ground.

2. An attenuator as claimed in claim 1 which further includes an insulating material means surrounding the second central conductor and the distributed resistance means between the conducting shield and the terminal means.

3. An attenuator as claimed in claim 2 wherein the insulating material means includes an insulating cylinder concentrically spaced about the second central conductor.

4. An attenuator as claimed in claim 3 wherein the conducter shield consists of a metal cylinder concentrically spaced about the first central conductor and the resistance means.

5. An attenuator as claimed in claim 4 which further includes a dielectric fluid located within the insulating cylinder and the metal cylinder.

6. An attenuator as claimed in claim 1 wherein the distributed resistance means consists of a series of ferrite beads mounted on the second central conductor.

7. An attenuator as claimed in claim 6 wherein the resistance means consists of a carbon composition resistor.

* * * * *